United States Patent
Bulovic et al.

(10) Patent No.: US 12,320,000 B2
(45) Date of Patent: Jun. 3, 2025

(54) HIGH-TEMPERATURE QUARTZ INSERT DESIGN FOR CONTROLLING MATERIAL INPUT

(71) Applicant: Massachusetts Institute of Technology, Cambridge, MA (US)

(72) Inventors: Vladimir Bulovic, Lexington, MA (US); Ella Wassweiler, Cambridge, MA (US); Anurag Panda, New Delhi (IN)

(73) Assignee: Massachusetts Institute of Technology, Cambridge, MA (US)

( * ) Notice: Subject to any disclaimer, the term of this patent is extended or adjusted under 35 U.S.C. 154(b) by 283 days.

(21) Appl. No.: 18/079,572

(22) Filed: Dec. 12, 2022

(65) Prior Publication Data

US 2023/0183860 A1   Jun. 15, 2023

Related U.S. Application Data

(60) Provisional application No. 63/289,429, filed on Dec. 14, 2021.

(51) Int. Cl.
*C23C 16/448* (2006.01)
*C23C 16/08* (2006.01)
*F16K 3/26* (2006.01)

(52) U.S. Cl.
CPC .......... *C23C 16/4481* (2013.01); *C23C 16/08* (2013.01); *F16K 3/26* (2013.01)

(58) Field of Classification Search
None
See application file for complete search history.

(56) References Cited

U.S. PATENT DOCUMENTS

| | | | |
|---|---|---|---|
| 2,608,996 A | 9/1952 | Forman | |
| 3,111,136 A | 11/1963 | Persidsky | |
| 3,112,759 A | 12/1963 | De Lucia | |
| 5,702,671 A | 12/1997 | Gerstel | |
| 7,426,939 B2 | 9/2008 | Jorg | |
| 7,431,968 B1 | 10/2008 | Shtein et al. | |
| 7,682,660 B2 | 3/2010 | Shtein et al. | |
| 9,490,120 B2 | 11/2016 | Barden et al. | |
| 10,930,494 B2 | 2/2021 | Bush et al. | |
| 2007/0068587 A1* | 3/2007 | Utterberg | F16K 27/041 137/872 |
| 2013/0089948 A1 | 4/2013 | Xiong et al. | |

(Continued)

FOREIGN PATENT DOCUMENTS

DE   4109858 A1   10/1992
DE   4206109 A1   9/1993

OTHER PUBLICATIONS

Hoerantner et al., High-Speed Vapor Transport Deposition of Perovskite Thin Films. ACS Applied Materials & Interfaces. Aug. 2019;11(36):32928-32936.

(Continued)

*Primary Examiner* — Michael P. Rodriguez
(74) *Attorney, Agent, or Firm* — Nields, Lemack & Frame, LLC

(57) ABSTRACT

A flow through valve can satisfy the manufacturing constraints encountered when handling materials at high temperatures and low pressures, for example during semiconductor thin-film manufacturing using techniques such as vapor transport deposition.

20 Claims, 15 Drawing Sheets

(56) References Cited

U.S. PATENT DOCUMENTS

2020/0024733 A1* 1/2020 Bulovic ................ C23C 16/455

OTHER PUBLICATIONS

Poindexter et al., High Tolerance to Iron Contamination in Lead Halide Perovskite Solar Cells. ACS Nano. Jul. 25, 2017;11(7):7101-7109.

Powell. Research Leading to High Throughput Manufacturing of Thin-Film CdTe PV Modules: Annual Subcontract Report Sep. 2004-Sep. 2005. Apr. 2006.

Shtein. Organic Vapor Phase Deposition and Vapor Jet Printing for Electronic and Optoelectronic Devices. Princeton University Doctoral Dissertation 2004.

* cited by examiner

US 12,320,000 B2

HIGH-TEMPERATURE QUARTZ INSERT DESIGN FOR CONTROLLING MATERIAL INPUT

CLAIM OF PRIORITY

This application claims priority to U.S. Provisional Patent Application No. 63/289,429, filed Dec. 14, 2021, which is incorporated by reference in its entirety.

FIELD OF THE INVENTION

The invention relates to an apparatus for and method of vapor transport deposition of volatile solid material.

BACKGROUND

Thin film manufacturing combines deposition of films at a fast rate with sub-nanometer control over film thickness. Researchers and engineers are continuously pushing the boundaries of deposition technologies and compatible materials. Historically, widely used deposition techniques such as evaporation and sputtering have been continuously applied to new sets of materials and applications.

SUMMARY

In one aspect, a flow through valve can include a flow through arm, the flow through arm including a gas inlet, a gas outlet, a precisely ground junction adjacent to the gas outlet, and an opening adjacent to a flow path from the gas inlet to the gas outlet, the opening extending less than 50% of a perimeter of a cross section of the flow through arm, and a chamber including a volatile material source reservoir, the chamber having a first bore and a second bore, the flow through arm passing through the first bore and the second bore, the first bore forming a surface-to-surface seal with the perimeter of the flow through arm and the second bore forming a seal with the precisely ground junction. The flow through arm can be configured to rotate the opening toward the volatile material source reservoir when in an open position and away from volatile material source reservoir when in a closed position.

In certain embodiments, the flow through arm can be quartz, borosilicate glass, sapphire, steel, stainless-steel, aluminum, or a ceramic, or combinations thereof.

In certain embodiments, the chamber can be quartz, borosilicate, glass, sapphire, steel, stainless-steel, aluminum, or a ceramic, or combinations thereof. In certain embodiments, the opening can extend less than 40%, less than 30%, less than 20% or less than 10% of a perimeter of a cross section of the flow through arm.

In certain embodiments, the opening can further include a diverter within the opening configured to divert the flow path in to the volatile material source reservoir.

In certain embodiments, the flow through arm can be a cylindrical tube.

In certain embodiments, the open position can be opposite the closed position.

In another aspect, a volatile delivery system can include a flow through valve as described herein, and an outer chamber housing the flow through valve.

In certain embodiments, the outer chamber can include a heater.

In another aspect, a method of making a film can include passing a carrier gas through a flow through arm, heating a source material in a volatile material source reservoir to form a vapor, orienting the flow through arm so that the carrier gas contacts the vapor at an opening in the flow through arm, and transporting the carrier gas including the vapor to a gas outlet of the flow through arm and into a deposition chamber.

In certain embodiments, the carrier gas can exit the flow through arm at a diverter before contacting the vapor and reenters the flow through arm.

In certain embodiments, the vapor can be combined with the carrier gas at the opening by a second flow from the volatile material source reservoir.

In certain embodiments, orienting the flow through arm can include rotating the flow through arm from a closed position to an open position.

In certain embodiments, the method can include providing input material to the volatile material source reservoir.

In certain embodiments, the method can include heating the flow through arm.

In certain embodiments, the method can include heating the volatile material source reservoir.

In certain embodiments, the source material can include a metal halide.

Other aspects, embodiments, and features will be apparent from the following description, the drawings, and the claims.

BRIEF DESCRIPTION OF DRAWINGS

FIG. 9A depicts the geometry used in implementing the simulation.
FIG. 9B depicts the range of deposition parameters and resulting $PbI_2$ concentration.
FIG. 9C depicts an example of the velocity profile through the material arm using the Zoom Box from FIG. 9A.
FIG. 9D depicts an example of the temperature profile through the material arm using the Zoom Box from FIG. 9A.
FIG. 9E depicts an example of the concentration distribution through the material arm using the Zoom Box from FIG. 9A.

DETAILED DESCRIPTION

A flow through valve is described herein. The valve can satisfy the manufacturing constraints encountered when handling materials at high temperatures and low pressures, for example during semiconductor thin-film manufacturing using techniques such as vapor transport deposition.

Figure 1:
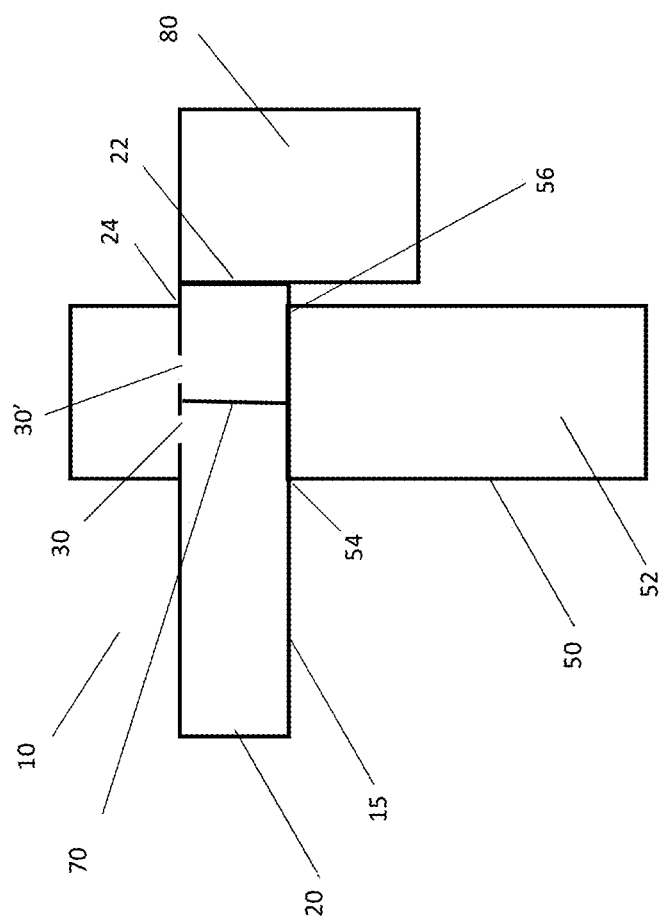
FIG. 1 depicts a valve in a close position.
Figure 2:
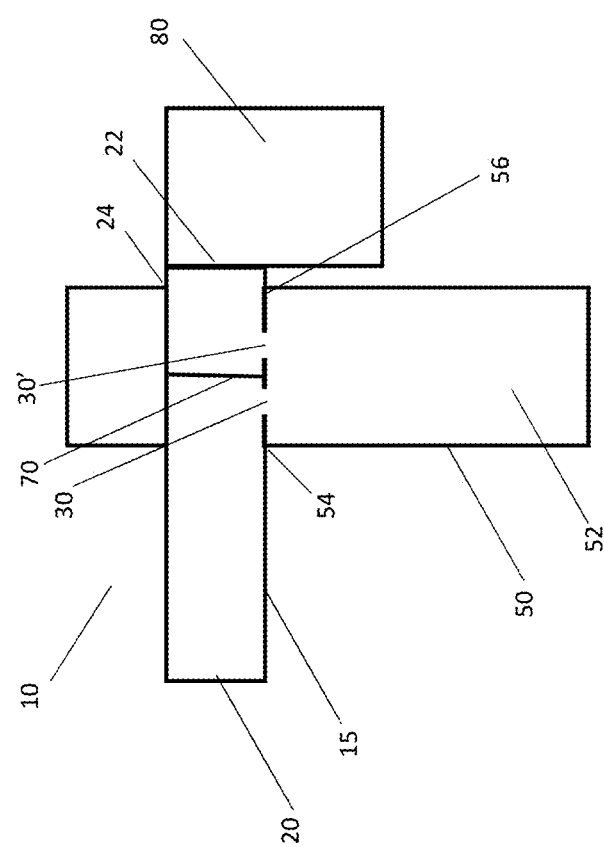
FIG. 2 depicts a valve in an open position.

Referring to FIGS. 1 and 2, a flow through valve 10 can include a flow through arm 15. The flow through arm 15 can included a gas inlet 20, a gas outlet 22, a precisely ground junction 24 adjacent to the gas outlet 22, and an opening 30 adjacent to a flow path 40 from the gas inlet 20 to the gas outlet 33. The opening, or hole, 30 can extend less than 50% of a perimeter of a cross section of the flow through arm. Flow through valve 10 also includes a chamber 50 including a volatile material source reservoir 52. Chamber 50 having a first bore 54 and a second bore 56, through which the flow through arm 15 passes. The flow through arm 15 passes through the first bore 54 to form a surface-to-surface seal with a perimeter of the flow through arm 15. The flow through arm 15 passes through the second bore 56 to form a seal with precisely ground junction 24. The flow through arm 15 can be configured to rotate the opening 30 toward the volatile material source reservoir 52 when in an open position, as shown in FIG. 2, and away from volatile material source reservoir 52 when in a closed position. Flow through valve 10 can deliver volatile material to deposition chamber 80 (not to scale).

In certain embodiments, the flow through arm can be quartz, borosilicate glass, or sapphire, or combinations thereof. The selection of materials suitable for the valve can depend on the operating conditions for the valve. The materials are selected to avoid reaction with or degradation of the materials being exposed to the valve as volatile material.

In certain embodiments, the opening can extend less than 50%, less than 40%, less than 30%, less than 20% or less than 10% of a perimeter of a cross section of the flow through arm. The size of the opening can be selected to permit appropriate mass transport characteristics while also providing structural integrity to the flow through arm to reduce possible breakage.

In certain embodiments, the opening can further include a diverter 70 (in FIG. 1 and FIG. 2) within the opening configured to divert the flow path in to the volatile material source reservoir. The diverter 70 can divide the opening into two openings (optional opening 30' in FIGS. 1 and 2). Alternatively, the diverter can be placed in the arm to cause the flow path to exit the arm and reenter the arm at a second opening.

In certain embodiments, the flow through arm can be a cylindrical tube.

In certain embodiments, the open position can be opposite the closed position. For example, the open position can be oriented 180 degrees from the closed position.

Figure 3A:
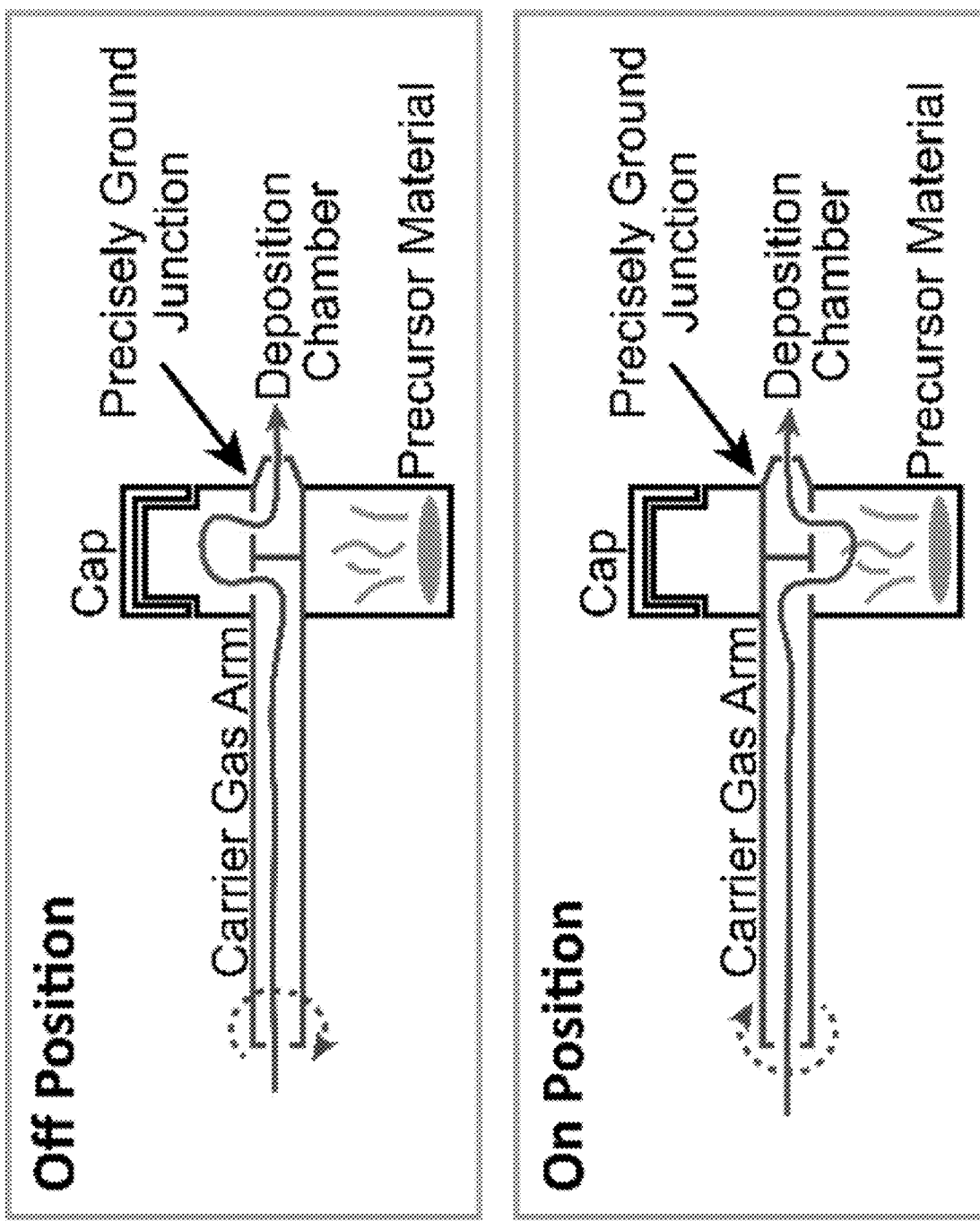
FIGS. 3A-3B depict a valve described herein.
Figure 3B:
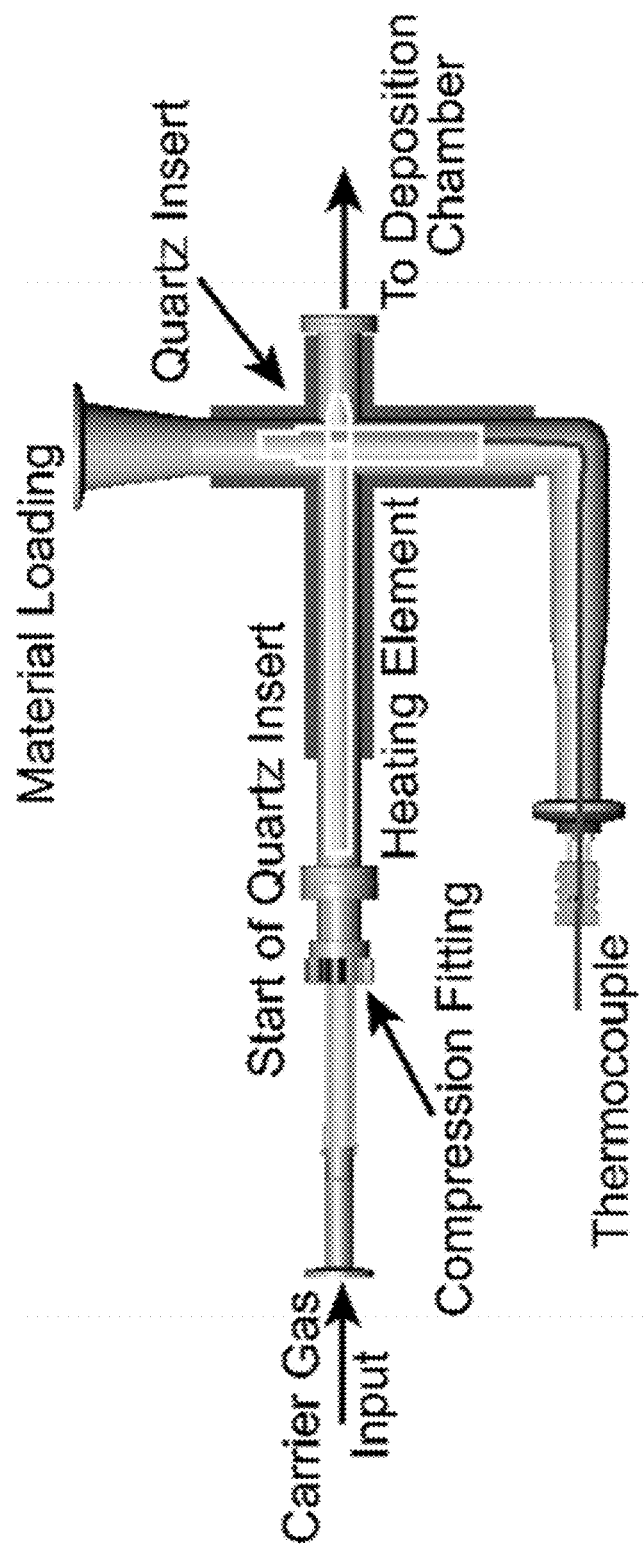
Figure 4:
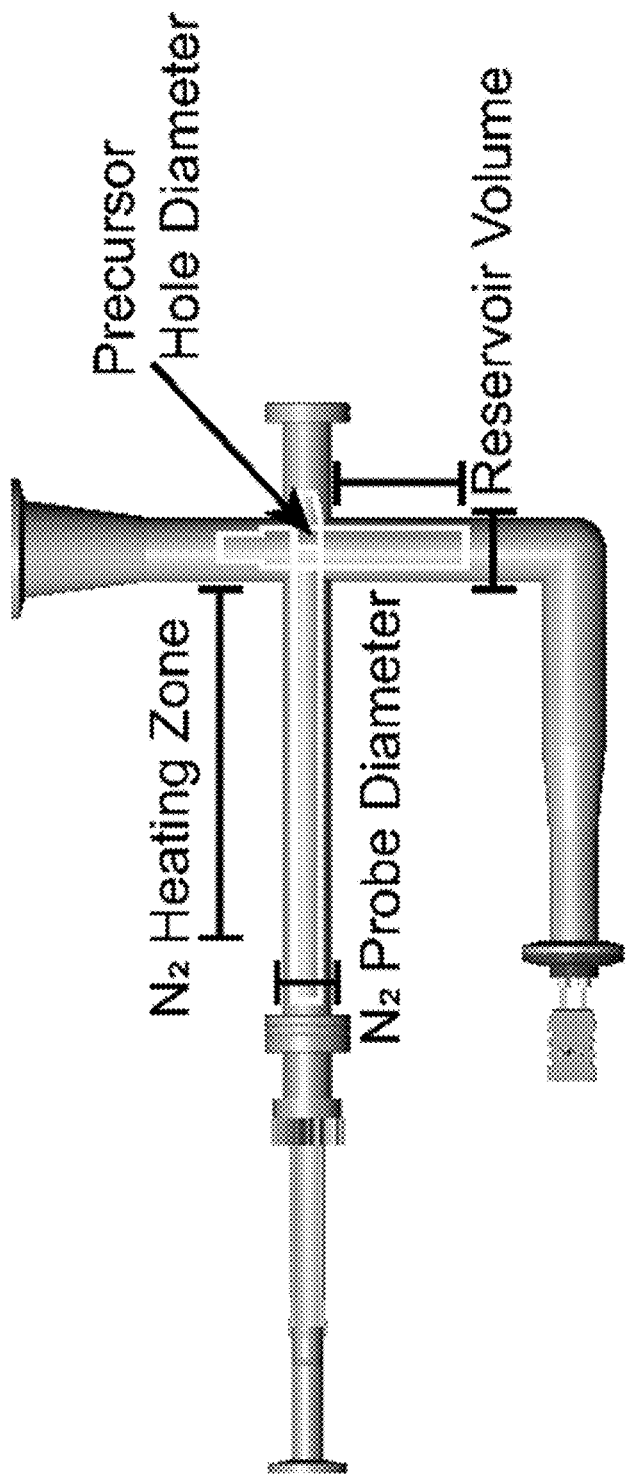
FIG. 4 depicts length requirements of the valve described herein.

In another aspect, a volatile delivery system can include a flow through valve as described herein, and an outer chamber housing the flow through valve, as shown in FIGS. 3A, 3B and 4.

In certain embodiments, the outer chamber can include a heater, as shown in FIG. 3B.

In another aspect and as described herein, a method of making a semiconductor film can include passing a carrier gas through a flow through arm, heating a semiconductor source material in a volatile material source reservoir to form a vapor, orienting the flow through arm so that the carrier gas contacts the vapor at an opening in the flow through arm, and transporting the carrier gas including the vapor to a gas outlet of the flow through arm and into a deposition chamber. For example, the carrier gas can exit the flow through arm at a diverter before contacting the vapor and reenters the flow through arm.

In certain embodiments, the vapor can be combined with the carrier gas at the opening by a second flow from the volatile material source reservoir. In one example, orienting the flow through arm can include rotating the flow through arm from a closed position to an open position.

In certain embodiments, the method can include providing input material to the volatile material source reservoir.

In certain embodiments, the method can include heating the flow through arm, heating the volatile material source reservoir, or both.

In certain embodiments, the semiconductor can include a metal halide or a perovskite material, as described below.

Vapor transport deposition (VTD) is a thin-film manufacturing technique that was developed as a combination of thermal evaporation and chemical vapor deposition. It is currently used for manufacturing organic and CdTe photovoltaics and LEDs. See, for example, Powell, R. C. *Research Leading to High Throughput Manufacturing of Thin-Film CdTe PV Modules: Annual Subcontract Report*, September 2004-September 2005; 2006 and Shtein, M. Organic Vapor Phase Deposition and Vapor Jet Printing for Electronic and Optoelectronic Devices. Doctoral Dissertation 2004, each of which is incorporated by reference in its entirety. VTD uses a hot carrier gas to transport sublimed material from source to substrate. Recently, the use of VTD has been used to deposit perovskite films for solar cells. See, for example, Hoerantner, M. T., et al., V. High-Speed Vapor Transport Deposition of Perovskite Thin Films. *ACS Applied Materials & Interfaces* 2019, 11, 32928-32936, which has been incorporated by reference in its entirety. Currently the most commonly used sublimation-based technique for deposition of perovskite films is thermal evaporation. VTD significantly improves upon this technique by increasing the deposition speed, film uniformity, and control over process parameters such as chamber pressure. The apparatus and method of VTD described herein allows for more precise control over materials with dramatically different sublimation temperatures (>130° C.), increasing material usage efficiency and throughput.

All vacuum deposition systems rely on the use of material holders, oftentimes boats, and shutters in order to control when deposition occurs. In thermal evaporation, a boat with dual shutters, one over the boat and one directly in front of the substrate can prevent any parasitic deposition before the intended film growth. Similarly in chemical vapor deposition (CVD) furnaces, boats and shutters can prevent the gasses from reaching the substrate and reacting before the intended time. Shuttering works well in applications where the deposition is line-of-sight.

In the system described herein, the most common compound used is methylammonium lead iodide (MAPbI$_3$), formed by combining lead iodide (PbI$_2$) and methylammonium iodide (MAI). PbI$_2$ sublimes at a much higher temperature 290° C. as compared to MAT, which sublimes at a lower temperature of around 160° C. MAI also reacts with stainless steel deposition chambers. The concern about high temperatures and reaction with metals prompted some groups to work with quartz CVD furnaces. However, quartz furnaces are not able to scale to large-area manufacturing tools. One reason is that the furnaces are more appropriately suited for batch manufacture, not continuous manufacture. Additionally, there is significant parasitic deposition from the uncovered source or non-vacuum tight seal before the carrier gas is turned on since deposition is not line-of-sight.

Therefore, to develop a VTD tool more suitable for manufacturing process, including continuous or longer cycle manufacturing processes, a mechanism was needed that can be used with perovskite precursors on a manufacturing scale while allowing for precise delivery of the material to the substrate. Unfortunately, no product on the market fits these needs. In one aspect, the system described herein requires materials that do not react with MAI, vacuum-tight sealing, and over 200° C. working temperatures as basic requirements before even considering proper precursor material handling. Off-the shelves vacuum valves, material boats, precision bore tubing, and quartz valves only partially fulfill the functionality necessary for perovskite VTD. Using one singular off-the-shelf technique will not be feasible as the limits of thin film manufacturing are extended into a design that not only has applications in VTD but in related fields.

The apparatus described herein was designed because there was no available tool that could be used to control sublimed material without degrading the holding reservoir. Referring to FIGS. 3A and 2B, a high-temperature quartz material reservoir design is shown. Referring to FIG. 3A, a quartz-based insert in the on and off positions with carrier gas is shown. Referring to FIG. 3B, a quartz material reservoir can be inserted into a stainless steel chamber approximating its use on a manufacturing line.

The insert can be made out of two modified quartz precision bore tubing pieces. As shown in FIG. 3A, a tube is the inner of the precision bore tubing while the black segments are the outer chambers. The inner tube is used for carrier gas injection. Close to the end of the quartz tube is a wall that directs the carrier gas flow into the selected chamber and back into the green, carrier tube before entering the deposition chamber. The black, outer sections are separated into two different small chambers. The top chamber is covered with a quartz cap and is used as a material bypass. The lower chamber is a material reservoir that contains the precursor power heated to sublimation temperature. In the Off Position, the valve closes by rotating the openings on the green, carrier gas injection tube to pass through the bypass chamber. Then when the valve is turned to the On Position, the holes face the precursor material reservoir and a carrier gas is allowed to flow through the sublimed vapors and out into the deposition chamber.

The material reservoir is designed to not only hold the solid precursor as it sublimes, but also to enable deposition in the equilibrium regime. In vapor deposition there are two main deposition regimes, the kinetic (where deposition rate is dependent on sublimation rate) and the equilibrium (where deposition rate is dependent on carrier gas flow rate) which exists on a continuum. Directing flow of the carrier gas through the material reservoir chamber sends it through a region saturated with precursor vapors and therefore pushes deposition towards the equilibrium regime. Depositing in the equilibrium regime is favorable especially in co-depositing more than one precursor because it is not tied to sublimation temperature. In the kinetic regime, deposition rates increase with temperature because more material will start subliming. However, increasing temperature of precursor material quickly causes degradation of that material. Through depositing in the equilibrium regime it is possible to tailor composition of films by controlling the deposition rate of different precursor materials through their carrier gas.

The quartz insert design is shown in FIG. 3A, but during use it is inserted into a stainless steel vacuum chamber as shown in FIG. 3B. The quartz valve must fit snugly into the stainless steel chamber. Since the heating of the systems is done from outside of the chamber any gaps between the quartz and stainless steel will result in significant thermal loss. Positioning the quartz inside of the stainless steel is critical because different thermal expansion coefficients for the quart and stainless steel could damage the equipment. The quartz tube component is terminated with a stainless steel flange which is vacuum sealed to the outside of the chamber via a compression fitting in what is standard techniques.

This quartz design has successfully heated up material and prevented deposition for 45 minutes. After rotation deposited films $100s$ of nanometers thick have been deposited over a one inch square substrate with the size of the current material reservoir. The quartz insert has operated successfully at temperatures around 400° C. and pressures below $5 \times 10^{-2}$ torr.

The length requirements of the apparatus are depicted in FIG. 4, which shows the importance of size requirements for successful material handling. As shown in FIG. 4, there are a number of size considerations when developing the full material arm in which the quartz insert sits. The dominant factors are the length required to fully heat the carrier gas, hole diameter within the nitrogen probe that allows the carrier gas to collect the precursor material, and the reservoir volume.

After the initial sublimation in the quartz reservoir section, the precursor material requires a heated carrier gas to remain in a gas form. The initial $N_2$ heating zone is the length necessary to heat the carrier gas to precursor sublimation temperature before entering the quartz reservoir to interact with the sublimed material. The length can be dependent on the temperature required, the tube diameter, and the carrier gas flow rate.

The hole diameter determines the rate at which the carrier gas flows into the reservoir chamber and the amount of containment the sublimed material experiences. These are competing requirements, as the larger the hole diameter the faster the carrier gas can flow without disturbing material but also the less likely there is to be a consistent saturation pressure of precursor material within the reservoir.

Finally, the reservoir volume determines how much material (and resulting film thickness) can be deposited without re-loading. Additionally it influences how much material is loaded and how much left-over volume will be used in determining the saturation pressure. In general, a stable partial pressure of material can be balanced with carrier gas flow rate to maintain an equbrium amount of material being delivered by the device. An amount of material in the reservoir can be provided to allow delivery of material for manufacture of layers of material on a substrate.

The apparatus shows in FIGS. 3A, 3B and 4 has been built is functional. The apparatus has successfully heated up material and prevented deposition for 45 minutes in the off state. After rotation to the on state, films having a thickness of hundreds of nanometers have been deposited over a one inch square substrate with the size of the current material reservoir all while maintaining the same deposition pressure within the chamber. The quartz insert has been operating successfully at temperatures around 400° C. and pressures below $5 \times 10^{-2}$ torr. The size of the reservoir can vary depending on the stainless steel outside chamber.

The apparatus described herein significantly improves over existing technology. Some of the improvements and advantages are described as follows.

1. Consistent Precursor Pressure within the Quartz Reservoir Throughout a Range of Carrier Gas Flow Rates.

Depositing in the carrier gas controlled, equilibrium regime requires flowing gas through a saturation pressure of precursor materials such that the sublimation rate of the solid precursor is not a limiting factor for the deposition rate. This is one of the unexpected advantages of the system and method described herein. Directing gas flow through a saturated material chamber is not a current aspect of design in any off-the-shelf valves or evaporation boats. For example, the flow rate can be selected to provide laminar flow of the carrier gas. The flow rate may be adjusted to accommodate different geometries of the vacuum system. Carrier gas flow rates can range from 0 to 35 sccm.

2. Controls Deposition Onset and Seals Volatile Precursors within the Quartz Reservoir During Heating to Sublimation Temperatures.

The seal is created through precision bore tubing which is usually a technique use to make very accurately sized quartz or glass tubing for characterization equipment. As applied to the system and method described herein, the technique has been extended to use as part of a larger design to contain a saturation pressure of precursor material within the reservoir.

3. Designed for Use with High-Temperatures and Materials that React with Metals.

The high-temperature quartz insert with material reservoir is an improvement over current designs because it extends valve functionality above 200° C. and to precursor materials that react with metals all while maintaining compatibility with large-area high-throughput manufacturing lines.

The design as presented so far is a prototype for a lab-scale system demonstration. Some additional design modifications would be necessary for a manufacturing line. Additionally the design could be simplified in order to make a simple high-temperature gas valve. Finally, although all that has been described so far has been made of quartz, glass could also be used as the valve material.

Figure 5A:
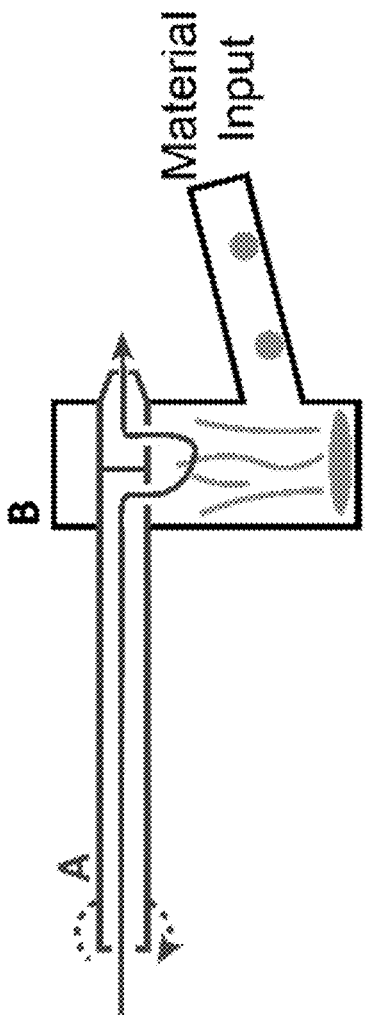
FIGS. 5A-5B depict optional embodiments of the valve described herein.
Figure 5B:
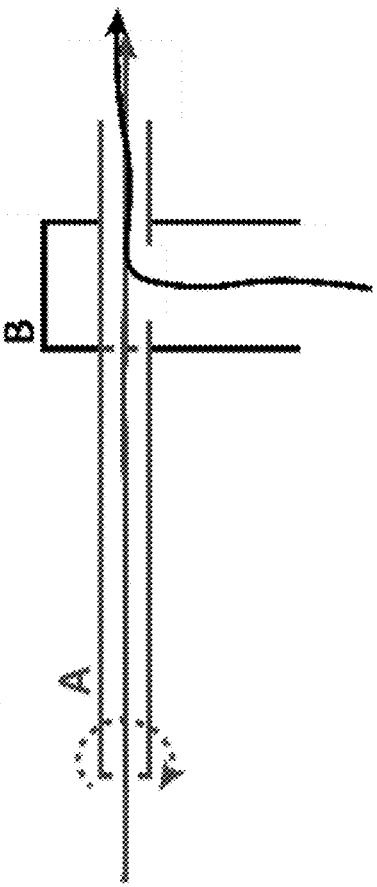

FIGS. 5A-5B depict optional expansions upon the current quartz valve design. Referring to FIG. 5A, the addition of a feeder screw can allow for compatibility with manufacturing lines. Referring to FIG. 5B, the material reservoir can be removed for a pure valve functionality.

The design in FIG. 5A shows a modification to the system in order to add a continuous flow of precursor material into the system. Feeder screws are common in manufacturing lines. Material deposition can be made continuous by adding small packets of new, un-sublimed material into the reservoir. Sublimation rates from precursor material can under certain conditions depend on material amount and the surface area of that material. Therefore, using a discrete but continuous flow of material into a new quartz arm via a feeder screw would allow for a more streamlined deposition process.

The design in FIG. 5B simplifies the design to get rid of the material reservoir and to make a system that can combine two gas streams. The green, carrier gas tube would still rotate in order to turn on and off the combination of materials, but instead of the lower section of the black, outer tube terminating in a reservoir would instead be another tube. This would be an improvement over current designs by increasing the operating temperature from 200° C. to 450° C. when compared to glass valves.

The three basic criteria for the valve described herein are to prevent parasitic material leakage and deposition, to prevent reaction of the chamber wall and boat with precursor materials, and to repeatedly function at temperatures up to 450° C. The quartz insert can be used above a 450° C. upper limit in a system in which the outer chamber is configured to operate in a higher temperature regime. In general, the highest operating temperature for the insert is the manufacturing temperature for the part. Creating high quality films within devices oftentimes depends on the interface between that film and other materials. If there is parasitic deposition before or after the intended deposition process then the interfaces between the film and the surrounding layer changes, sometimes unpredictably. Additionally there have been demonstrations that the presence of stainless steel around specifically the MAI precursor can result in the presence of iron from the stainless steel in the final film. See, for example, Poindexter, J. R, et al., T. High Tolerance to Iron Contamination in Lead Halide Perovskite Solar Cells. *ACS Nano* 2017, 11, 7101-7109, which is incorporated by reference in its entirety. In order to get a high quality and reproducible film impurities incorporation needs to be minimized. Therefore the areas with the highest concentration of precursor materials need to be protected from impurities. Finally, sublimation relies on high temperatures so the parts associated with sublimation need to be able to withstand that temperature over many depositions.

Examining the different tools on the market today allows us to figure out how they achieve different characteristics and then integrate those characteristics into a novel design described herein. None of the prior structures met the needs of the systems described herein.

TABLE 1

Overview of different valves and material boats currently on the market. X's mark where different techniques fit the requirements of the invention described herein.

| | Prevents Parasitic Material Leakage/Deposition | Does Not React with Precursor Materials | High Temperature Compatible (>200° C.) |
|---|---|---|---|
| Valves | | | |
| Angle Valve | X | | |
| All-Metal Valve | X | | |
| Harsh Process Valve | X | | |
| Glass Valve | X | X | |
| Material Boat | | | |
| Knudsen Cell | | | X |
| Baffled Boat | | | X |
| Ceramic Crucible | | X | X |
| Quartz Boat | | X | X |
| The valve described herein | X | X | X |

Vacuum Valves

Vacuum valves are one of the most common tools for vapor-based manufacturing. They are used to separate different chambers or sections of the system from each other. Additionally, they are used when there is a need to maintain a pressure differential between two systems. One key consideration when trying to apply vacuum valves to our system is the temperature compatibility. The highest working temperature valves on the market today are all-metal valves produced by companies such as Kurt J Lesker or MDC Vacuum which can only achieve a maximum bake-out temperature of up to 200° C. around five times before needing replacement parts. A similar product by Nor-Cal is called a linear harsh process valve. However, this product can also only achieve working temperatures up to 200° C. In order to prevent parasitic deposition from the sublimed materials and to prevent reactions in the chamber, the valves in our system need to be heated to over 200° C. for MAI and over 290° C. for $PbI_2$. Finally, since the valves are made of mostly metallic components they will react with MAI.

Therefore, vacuum valves will not work for this application but show ways in which one can effectively seal in material prior to deposition.

Material Boats

Our deposition process is not line-of-sight, therefore once the material starts reaching sublimation temperature but has not reached deposition temperature it will start to parasitically deposit in unwanted locations. The best method to prevent the diffusion of material before deposition is to control it via a vacuum-tight valve or shutter.

In thermal evaporation, boats hold material, and are then resistively heated to evaporate material onto a substrate. As a line-of-sight deposition process, thermal evaporation only requires a chamber shutter below the substrate to prevent parasitic deposition on the substrate. Common boat types include ceramic boats for materials that react with metals, and baffled tungsten boats for organic precursors. A Knudsen Cell is another commonly used material boat that has its own metallic shutter and can be lined with ceramics. Finally, in an effort to adapt subliming perovskite precursors with CVD furnaces, researchers have added quartz boats to the system. All of these boats except for the Knudsen Cell do not contain any shuttering. While the Knudsen Cell contains a shutter, it is loosely fitting and made of metal so likely to both allow for parasitic deposition and react with the precursor material. However, Knudsen cells reveal ways to build up precursor vapors and quartz boats show a material resistant to MAI. Both details help with a final instrument design.

Precision Bore Tubing

In material analysis it can be critical to have the semi-disposable material holder to precisely fit within the analysis chamber. Precision bore tubing is a technique that makes glass tubing to exceedingly accurate diameters. Commonly the error in diameter on the tubes resulting from this technique are ±0.02%. While not a valve or a material boat, using precision bore tubing techniques can allow for the creation of tight seals which are used in the design described herein, which makes use of precisely ground junctions.

It can be important to note that both of these expanded designs require a stainless steel chamber fitted tightly over the quartz components in order to achieve sustainable vacuum pressures. Operating pressures can be from 0.05 to 5 torr.

The device described herein can be used in other circumstances, for example, processes that involve delivering a volatile material in a controlled atmosphere environment. Some non-limiting examples follow.

Glass Valves

Glass valves are common tools in Schlenk lines and other chemical processes since they not react with precursor materials and are capable of reaching $10^{-7}$ pressures. However, 200° C. is the maximum working temperatures for these valves due to the dependence on a Teflon based plug to turn on/off the valve. Additionally, the control knob is placed close enough to the valve itself where the 80° C. maximum Teflon plug working temperature would influence the valves working temperature due to thermal diffusion. Finally, although glass valves work well in applications such as Schlenk lines, they are not easy to use on manufacturing lines. Although the quartz insert itself may not be trusted over long periods of time to hold vacuum, the idea with an outer chamber could be adapted to harsh processes, including corrosive precursor materials.

Glass Chromatography

A final application without much modification would be in gas chromatograph systems. Currently in order to analyze a solid, one would first dissolve that solid within a solvent. The solvent/solid system then is converted into a gas and sent through the machine. However, introducing a solvent into the system can complicate the results as the gas chromatograph would also analyze the solid/solvent interaction. The quartz insert described here could be used as a direct solid to gas sampler and avoid any solvent interactions in the data. As described the system would directly interact with a gas source inlet since the carrier gas for the gas chromatograph acts similarly to the carrier gas in the VTD system described herein.

Figure 6A:
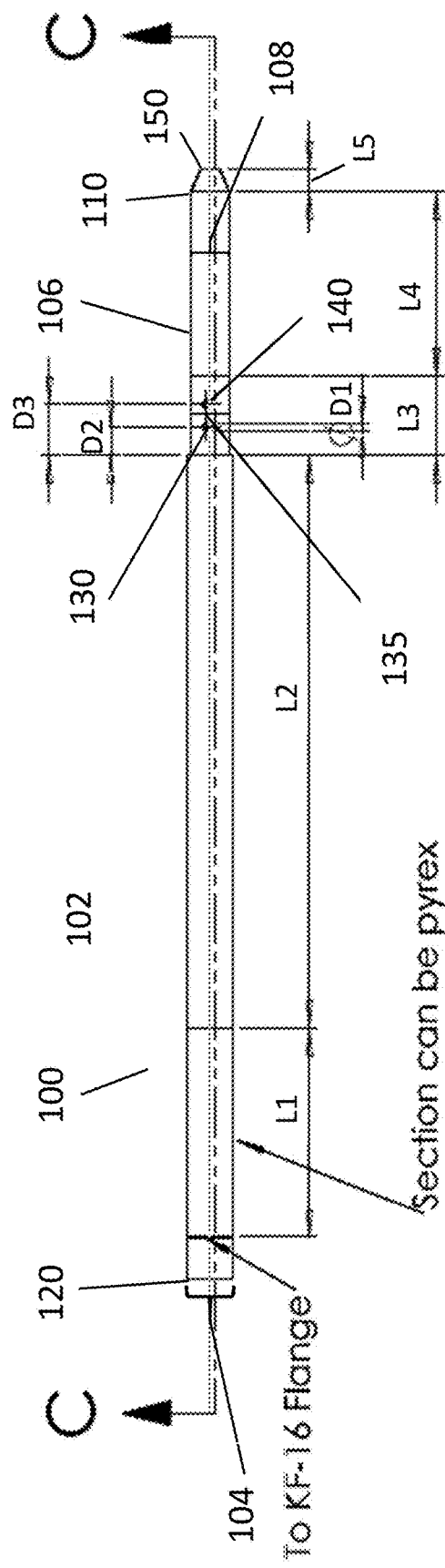
FIG. 6A is a drawing depicting a flow through arm.
Figure 6B:
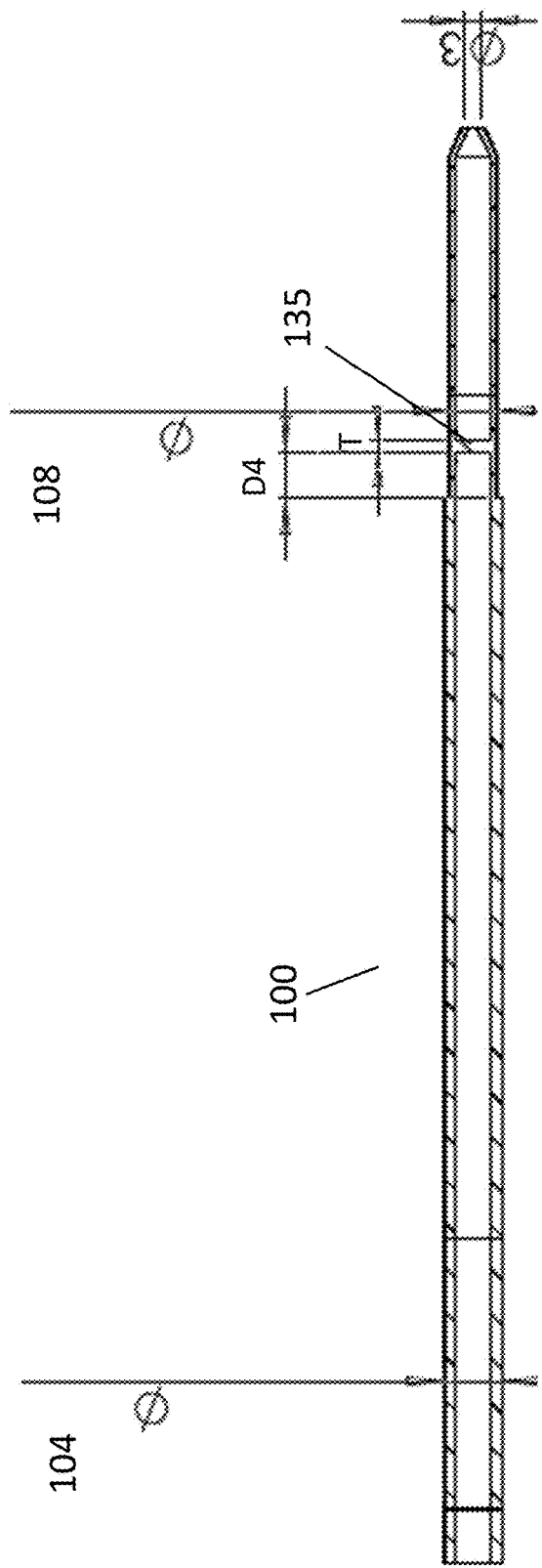
FIG. 6B is a drawing depicting a cut-through view of the flow through arm of FIG. 6A along line C-C.
Figure 6C:
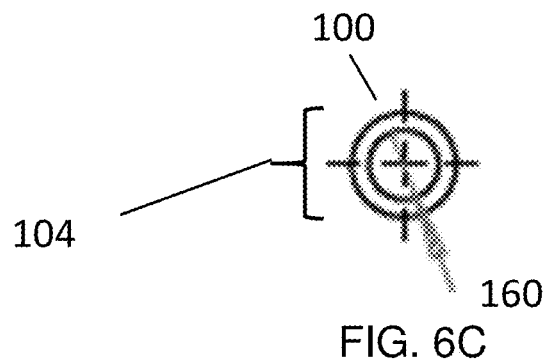
FIG. 6C is a drawing depicting a cross-section of a flow through arm of FIG. 6A.

Referring to FIG. 6A-6B, flow through arm 100 can have a length 102 and an outer diameter 104. The length 102 can have a narrowed region 106 having a second diameter 108 adjacent to precision end 110. Arm 100 has a proximal end 120 and a distal end 150. The proximal end 120 can be a gas inlet and the distal end 150 can be a gas outlet. A flow path extends along flow through arm along length 102. Precision end 110 can include a precision ground junction adjacent to the distal end 150. Opening 130 is in a wall of the narrowed region 106 and can be between a diverter 135 and proximal end 120. A second opening 140 is in a wall of the narrowed region 106, is substantially axially aligned with opening 130, and can be between the diverter 135 and distal end 150. Referring to FIG. 6C, flow through arm 100 can have an inner diameter 160.

Figure 7A:
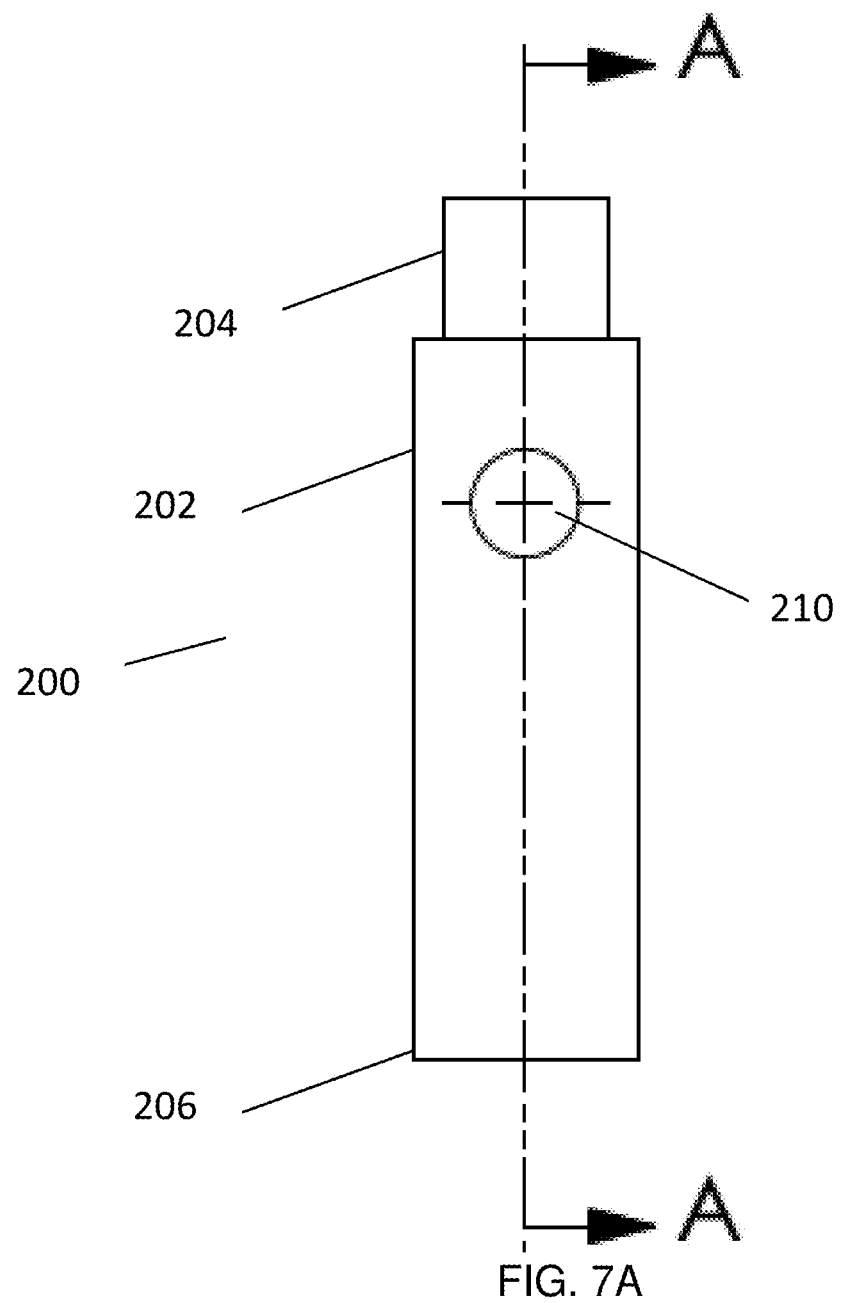
FIG. 7A is a drawing depicting a chamber.
Figure 7B:
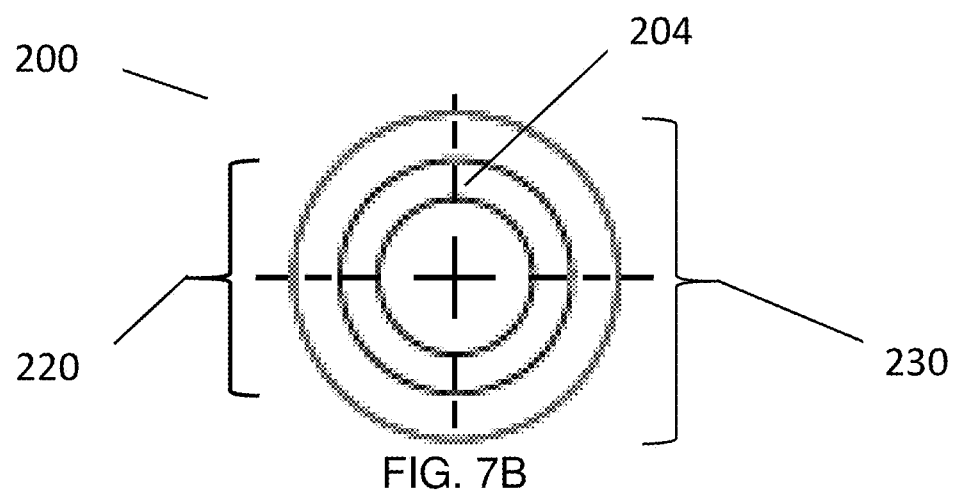
FIG. 7B is a drawing depicting a top view of the chamber for FIG. 7A.
Figure 7C:
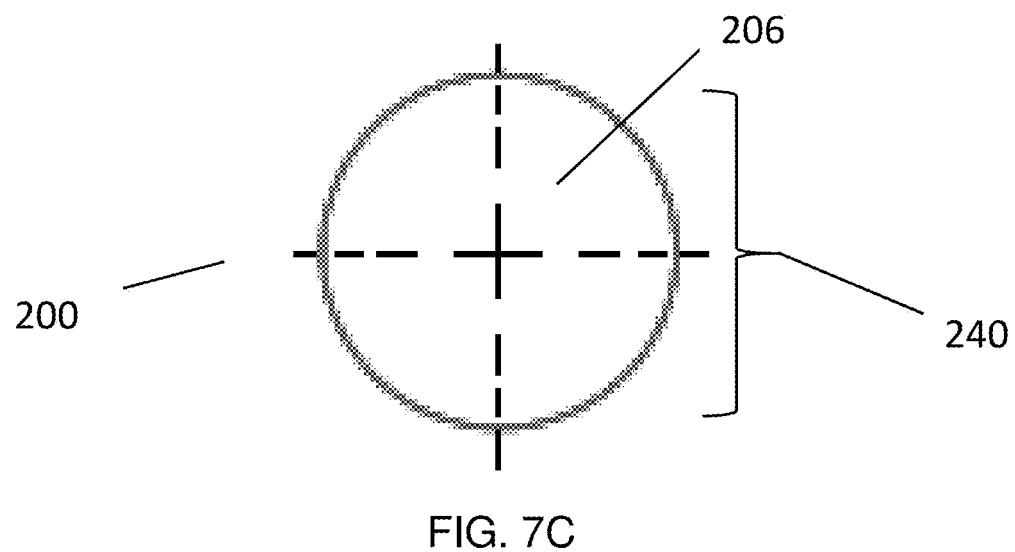
FIG. 7C is a drawing depicting a bottom view of the chamber for FIG. 7A.
Figure 7D:
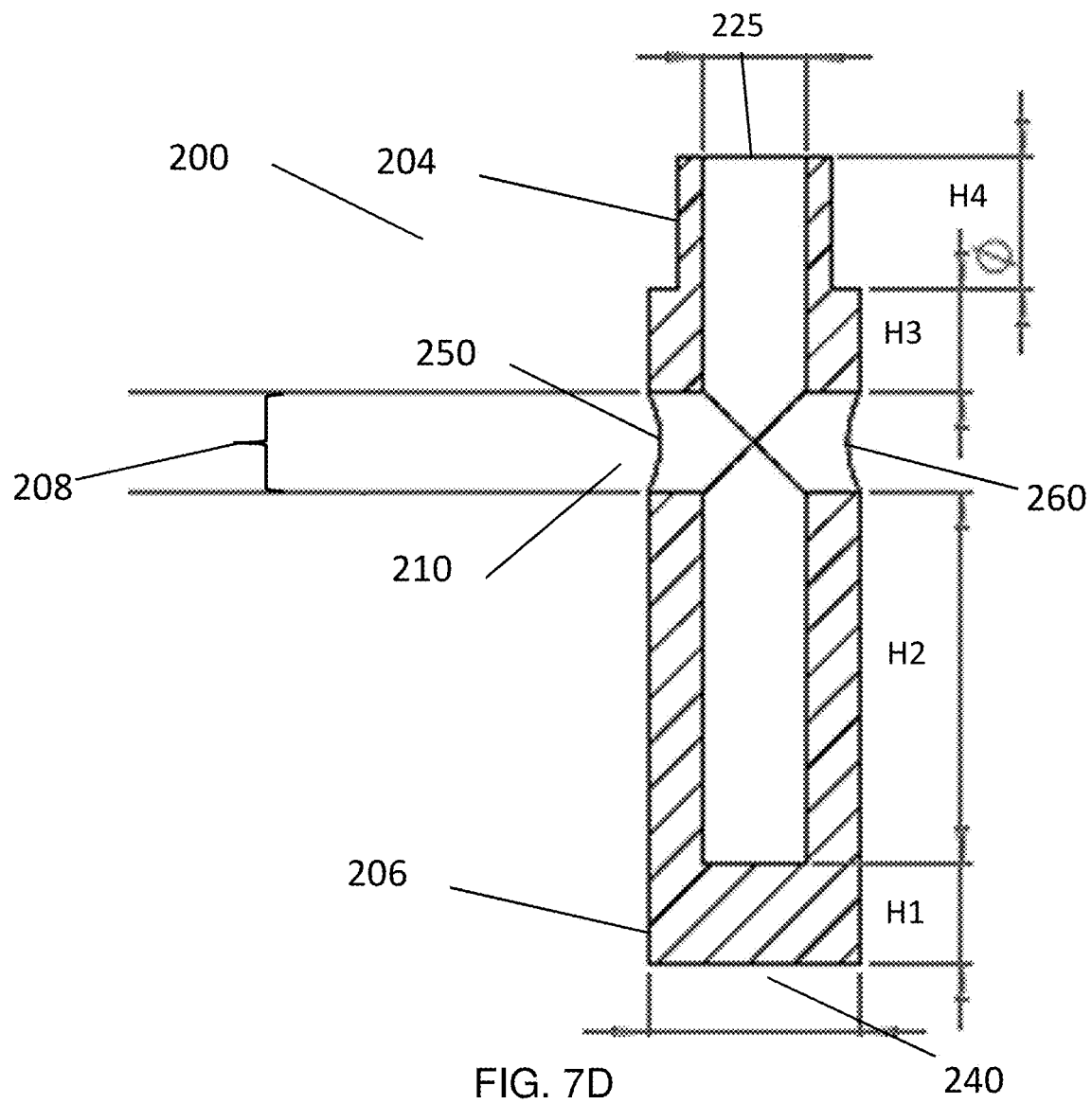
FIG. 7D is a drawing depicting a cut-through view of the chamber for FIG. 7A along line A-A.

Referring to FIGS. 7A-7D, chamber 200 can include a housing 202 that includes a volatile material source reservoir. Chamber 200 can include a top 204 and a bottom 206. Referring to FIG. 7B, top 204 of chamber 200 can have an inner diameter portion 220 and outer diameter portion 230. Chamber 200 can include an arm receiver 210. The inner diameter portion 220 is sized to fit a cap 300 (not shown, see FIGS. 8A-8B). Referring to FIG. 7C, bottom 206 of chamber 200 can have an outer diameter portion 240. Outer diameter portion 240 can be substantially the same as outer diameter 230. Referring to FIG. 7D, chamber 200 includes arm receiver 210. Arm receiver 210 includes a first bore 250 and a second bore 260. Narrowed region 106 of arm 100 having a diameter 108 (not shown) fits tightly in first bore 250 and second bore 260, forming a surface-to-surface seal a precisely ground junction. To form a seal, chamber seal diameter 208 of the first bore 250 and the second bore 260 matches diameter 108. Diameter 108 and diameter 208 are substantially identical. Top 204 can have a top inner diameter 225. Bottom 206 can have a bottom diameter portion 240.

Figure 8A:
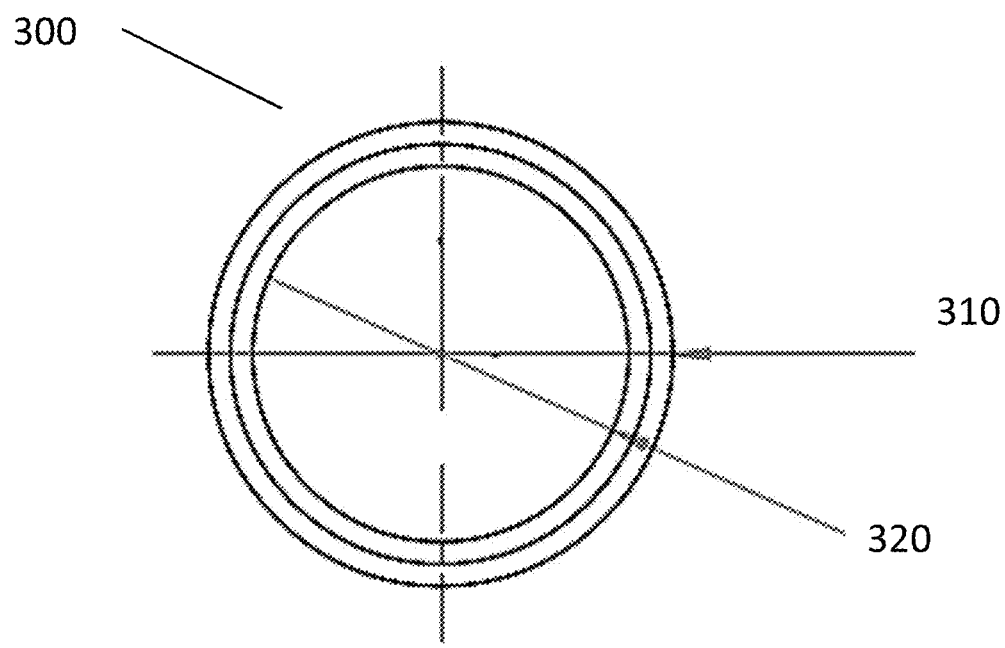
FIG. 8A is a drawing depicting an end view of a cap.
Figure 8B:
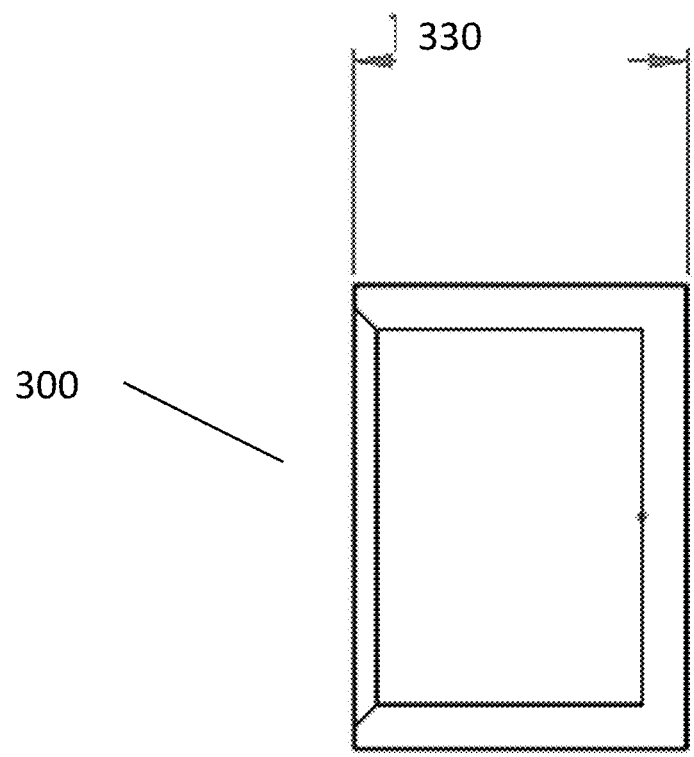
FIG. 8B is a drawing depicting a side view of a cap.

Referring to FIGS. 8A-8B, cap 300 can fit and form a seal on top 204 of chamber 200 (not shown). Cap 300 has an outer cap diameter 310, an inner cap diameter 320 and a cap height 330.

The sizes and locations of the features of the apparatus can vary. The relative location of the features can be important to produce a functioning apparatus. Referring to FIGS. 6A-6C, length 102 can be the sum of L1, L2, L3, L4 and L5. Each opening 130 and 140, independently, can have a diameter D1. Each D1 can be 10%, 20%, 30%, 40% or 50% of the outer diameter 104. The narrowed region 106 can begin a length L1 plus L2 from the proximal end 120. Opening 130 can be a distance D2 from the length L1 plus L2. Opening 140 can be at a distance D3 from the length L1 plus L2. Diverter 135 can be a distance D4 from the length L1 plus L2. The diverter 135 can have a thickness T. Referring to FIG. 7D, chamber 200 can have a height that is the sum of H1, H2, H3, H4 and chamber seal diameter 208.

The flow through arm can the chamber can be quartz. In one example, proximal end 120 through length L1 can be a borosilicate.

In one example, L1 can be 55 mm, L2 can be 150 mm, L3 can be 21 mm, L4 can be 48 mm, L5 can be 6 mm, D1 can be 2 mm, D2 can be 7.5 mm, D3 can be 13.5 mm, D4 can be 9.5 mm, T can be 2 mm, outer diameter 104 can be 12 mm, narrowed region 106 can be 10 mm, and inner diameter 160 can be 8 mm. The taper at distal end 160 can have an opening diameter of 3 mm. Chamber seal diameter 208 can be 10 mm. Bottom diameter portion 240 can be 21 mm. Top inner diameter 225 can be 10 mm. H1 can be 10 mm, H2 can be 37 mm, H3 can be 10 mm, and H4 can be 13 mm. Outer cap diameter 310 can be 21 mm. Inner cap diameter 320 can be 17 mm. Cap height 330 can be 15 mm. The relative dimensions noted in this example can vary. For example, the relative locations and dimensions can be altered.

The flow through valve is a combination of the flow through arm and the chamber as described herein and fits within a stainless steel housing connected to a deposition chamber or other instrument as shown in FIGS. 3A, 3B and 4. The deposition chamber can be, for example, a vapor transport deposition system as described, for example, in U.S. Patent Publication No. 2020/024733, which is incorporated by reference in its entirety.

Examples of the semiconductor material that can be deposited using the flow through valve apparatus include II-VI semiconductor materials, III-V semiconductor materials, organic semiconductor materials, perovskite materials, or precursors thereof. The semiconductor material can be deposited to create, for example, high quality semiconductor film materials for a variety of applications, including photovoltaics, photosensors, light emitting devices, or charge storage devices. The semiconductor material can include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys. The perovskite semiconductor can include a material having the formula (I)

$$(A{:}A')(Pb{:}B')X_3 \qquad (I)$$

where A is an organic cation, A' is an organic or an inorganic cation different from A', B' is a divalent metal cation or missing, and X is a halide ion. For example, B' can be Sn, Cu, Ni, Co, Fe, Mg, Mn, Sr, Zn, Pd, Cd, Ge, Yb, Ce, or Eu. In certain circumstances, A' can be formamidinium or cesium. In certain circumstances, A can be methylammonium, ethylammonium, propylammonium (including isopropylammonium), butylammonium, or phenethylammonium.

To further investigate the material holder's capabilities, a simulation was designed using the finite elemental analysis software COMSOL. Since the system was designed to use the carrier gas as the primary determinant of deposition rate, operation in the laminar flow regime and with a dilute amount of precursor material was assumed. In the model, the two influential components to accurately describe are the sublimation of the precursor material and the transport of that material out of the material holder into the main chamber. To find this rate, the Hertz-Knudsen Equation and Clausius-Clapeyron Relation were combined. The simulation results are shown in FIGS. 9A-9E.

Figure 9A:
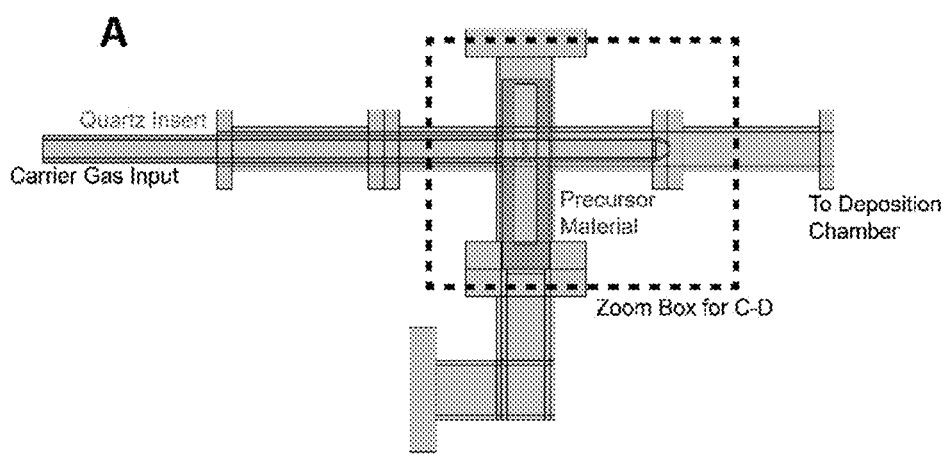
FIGS. 9A-9E show COMSOL simulations of the $PbI_2$ material arm.
Figure 9B:
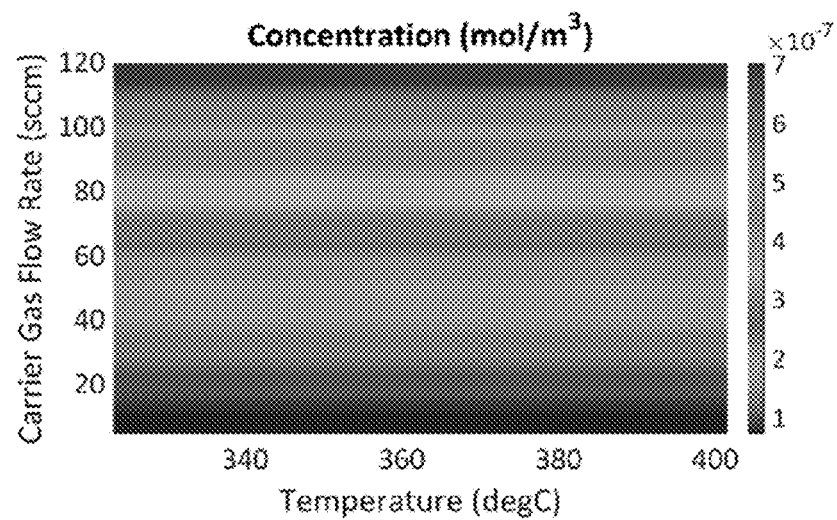
Figure 9C:
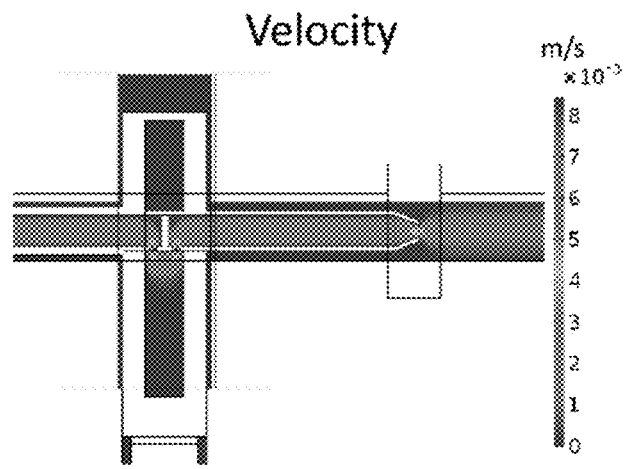
Figure 9D:
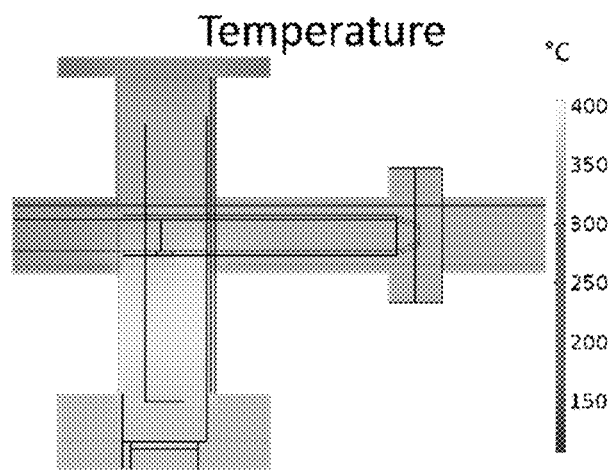
Figure 9E:
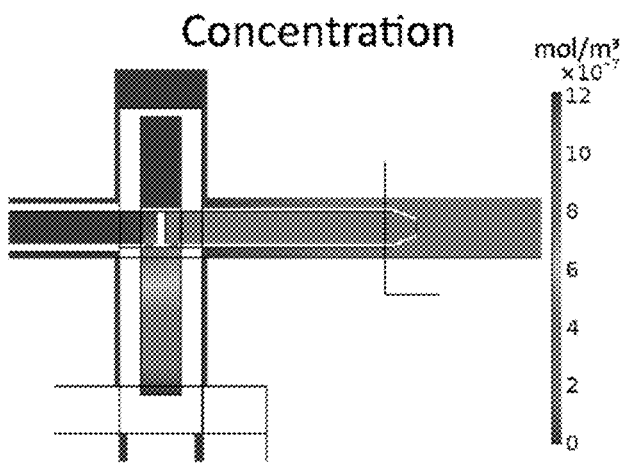

FIG. 9A shows the geometry used in the COMSOL model with the quartz insert highlighted in red, and the precursor material location in green. Using the laminar flow, heat transfer, and dilute species concentration modules, we simulate the inner workings of the material arm as it occurs during deposition. As seen in FIG. 9C, the velocity profile out of the quartz insert nozzle rapidly reaches a continuous, stable flow. Through careful wrapping of the material arm stainless steel chamber with heating tape and thermocouple readers allows for consistent heating throughout. High concentration of the precursor material is successfully contained to within the quartz section of the material arm to minimize any potential degradation due to the reactive iodine subcomponent. Therefore, the material arm design described herein allows for a wide range of deposition parameters while meeting the deposition system requirements.

Figure 10:
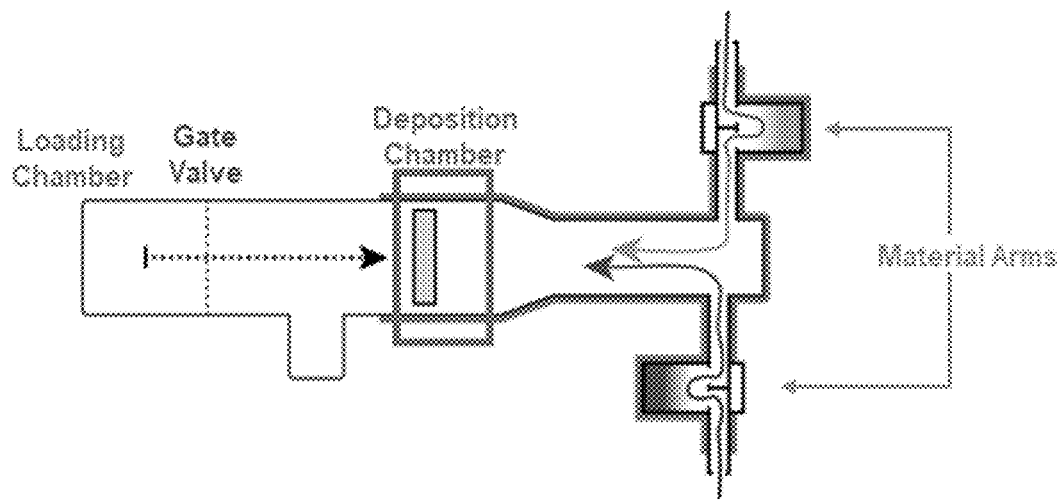
FIG. 10 is a schematic depicting a full VTD system.

Using the method for precise controlling of the wide range of precursors and designs for the critical elements of material transfer described herein, the integration into a full VTD system is possible. FIG. 10 shows a schematic of a full VTD system. The system as shown is setup with two different precursor material arms in order to deposit MAPbI$_3$. Each precursor has a unique material arm with its own carrier gas source for MAI and for PbI$_2$. By using individual precursor material arms, the system can tailor the deposition parameters to be specific to that material. The substrate can be moved via a stage from the loading chamber and into the deposition chamber (indicated by the dotted arrow). A moving stage allows for quick substrate changes without cooling down the chamber. The material arm and deposition chamber geometry allow for continuous heating from the input of the carrier gas until slightly past the substrate. The wrapping style and amount of heater tape can be tailored to both the geometry and thermal mass of each chamber section with ~25 total thermocouples checking for thermal variation. Substrate temperature can range from 35 to 60° C.

As shown in FIG. 10, the system can be a co-deposition system. A co-deposition increases deposition speed and improve control over the composition of the perovskite film. This can be an improvement over sequential deposition by improving the ability to attain complete and even conversion of the full film in parallel with building a film thickness with good capability for absorbing light. Sequential deposition often has to rely on multiple PbI$_2$ depositions with MAI conversion steps in order to build up to an active layer thickness capable of absorbing most incoming light. Each of the precursor materials in these paired steps can be deposited independently in its own unique set of optimal conditions using the delivery system described herein connected to a deposition chamber. Overall, this makes the deposition process longer than with co-deposition, which can be achieved with the system described herein. While depositing both materials in parallel the uniformity of conversion throughout the film is higher than a sequential process. With co-deposition, the improved control over the stoichiometry of the perovskite film means that substrate heating during deposition and post-deposition annealing should not be required. This can gives an improved control over the final film composition and can make it easier to produce multicomponent films.

Figure 11A:
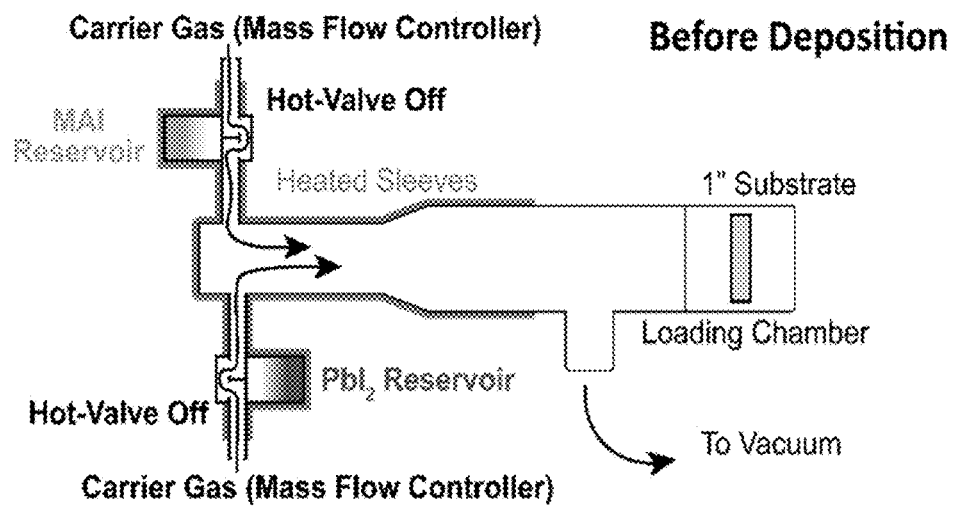
FIGS. 11A-11B depict a before deposition state and a during deposition state.
Figure 11B:
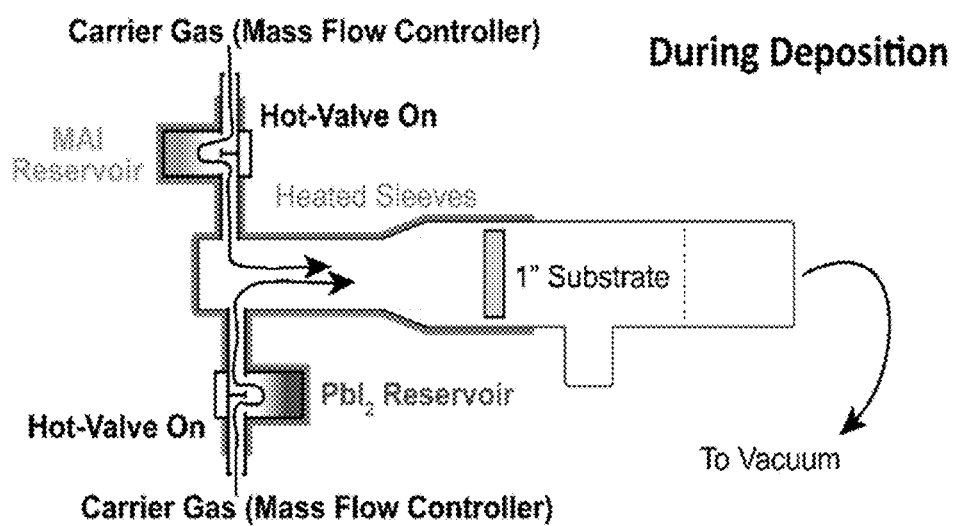

In order for rapid switching of substrates with minimal influence to both temperature and fluid flow, there is a before deposition state and during deposition state defined as shown in FIGS. 11A and 11B. Before deposition the substrate is in the loading chamber with the gate valve closed. Carrier gas can flow through the system in a mimic of during deposition by using a port situated very close to the gate valve. Then when deposition occurs (FIG. 11B), a gate valve is opened and the substrate is translated into the heated deposition zone and vacuum is pulled from the loading chamber. Independent material arm temperatures can range from 295 to 723K. Deposition zone temperatures can range from 295 to 723K.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. It should also be understood that the appended drawings are not necessarily to scale, presenting a somewhat simplified representation of various features and basic principles of the invention.

What is claimed is:

1. A flow through valve comprising:
   a flow through arm, the flow through arm including a gas inlet, a gas outlet, a precisely ground junction adjacent to the gas outlet, and an opening adjacent to a flow path from the gas inlet to the gas outlet, the opening extending less than 50% of a perimeter of a cross section of the flow through arm; and
   a chamber including a volatile material source reservoir, the chamber having a first bore and a second bore, the flow through arm passing through the first bore and the second bore, the first bore forming a surface-to-surface seal with the perimeter of the flow through arm and the second bore forming a seal with the precisely ground junction,
   wherein the flow through arm is configured to rotate the opening toward the volatile material source reservoir when in an open position and away from volatile material source reservoir when in a closed position.

2. The flow through valve of claim 1, wherein the flow through arm is quartz, borosilicate glass, sapphire, steel, stainless-steel, aluminum, or a ceramic.

3. The flow through valve of claim 1, wherein the chamber is quartz, borosilicate, glass, sapphire, steel, stainless-steel, aluminum, or a ceramic.

4. The flow through valve of claim 1, wherein the opening extends less than 40% of a perimeter of a cross section of the flow through arm.

5. The flow through valve of claim 1, wherein the opening extends less than 30% of a perimeter of a cross section of the flow through arm.

6. The flow through valve of claim 1, wherein the opening extends less than 20% of a perimeter of a cross section of the flow through arm.

7. The flow through valve of claim 1, wherein the opening extends less than 10% of a perimeter of a cross section of the flow through arm.

8. The flow through valve of claim 1, wherein the opening further includes a diverter within the opening configured to divert the flow path in to the volatile material source reservoir.

9. The flow through valve of claim 1, wherein the flow through arm is a cylindrical tube.

10. The flow through valve of claim 1, wherein the open position is opposite the closed position.

11. A volatile delivery system comprising a flow through valve of any one of claims 1-10, and an outer chamber housing the flow through valve.

12. The volatile delivery system of claim 11, wherein the outer chamber includes a heater.

13. A method of making a film comprising:
    passing a carrier gas through the flow through arm of the flow through valve of claim 1;
    heating a source material in the volatile material source reservoir to form a vapor;
    orienting the flow through arm so that the carrier gas contacts the vapor at an opening in the flow through arm; and
    transporting the carrier gas including the vapor to the gas outlet of the flow through arm and into a deposition chamber.

14. The method of claim 13, wherein the carrier gas exits the flow through arm at a diverter before contacting the vapor and reenters the flow through arm.

15. The method of claim 13, wherein the vapor is combined with the carrier gas at the opening by a second flow from the volatile material source reservoir.

16. The method of claim 13, wherein orienting the flow through arm includes rotating the flow through arm from the closed position to the open position.

17. The method of claim 13, further comprising providing input material to the volatile material source reservoir.

18. The method of claim 13, further comprising heating the flow through arm.

19. The method of claim 13, further comprising heating the volatile material source reservoir.

20. The method of claim 13, wherein the source material includes a metal halide.

* * * * *